United States Patent [19]

Hatayama et al.

[11] Patent Number: 4,956,818
[45] Date of Patent: Sep. 11, 1990

[54] MEMORY INCORPORATING LOGIC LSI AND METHOD FOR TESTING THE SAME LSI

[75] Inventors: Kazumi Hatayama; Terumine Hayashi, both of Hitachi, Japan

[73] Assignee: Hitachi, Ltd., Tokyo, Japan

[21] Appl. No.: 251,913

[22] Filed: Sep. 30, 1988

[30] Foreign Application Priority Data

Oct. 2, 1987 [JP] Japan .................................. 62-249162

[51] Int. Cl.⁵ .................................................. G11C 7/00
[52] U.S. Cl. .............................. 365/189.08; 365/201; 371/21.1; 371/22.6
[58] Field of Search .......................... 365/201, 189.08; 371/21, 25; 324/73 AT

[56] References Cited

U.S. PATENT DOCUMENTS

| | | | |
|---|---|---|---|
| 3,961,254 | 6/1976 | Cavaliere et al. ............. | 324/73 AT |
| 4,074,851 | 2/1978 | Eichelberger et al. ........ | 324/73 AT |
| 4,481,627 | 11/1984 | Beauchesne et al. ......... | 371/25 |
| 4,710,930 | 12/1987 | Hatayama et al. ............ | 371/25 |
| 4,825,414 | 4/1989 | Kawata .......................... | 365/201 |

FOREIGN PATENT DOCUMENTS

57-3107  1/1982  Japan .
61-204744  9/1986  Japan .

*Primary Examiner*—Glenn Gossage
*Attorney, Agent, or Firm*—Kenyon & Kenyon

[57] ABSTRACT

A memory incorporating logic Large Scale Integration (LSI) and a method for testing the same LSI includes signal path switching circuit portions which are disposed in the paths of a memory portion and a logic circuit portion. A test signal input and an output signal can be observed at an input and output terminal portion so as to be able to effect a dynamic function test of the memory portion. Further there is disposed a logic circuit test signal memory circuit portion, which switches over the signal path switching circuit portions to the logic circuit portion so as to be able to effect a test of the logic circuit portion, independently of the state of the memory portion.

12 Claims, 5 Drawing Sheets

MEMORY INCORPORATING LOGIC LSI AND METHOD FOR TESTING THE SAME LSI

BACKGROUND OF THE INVENTION

This invention relates to a memory incorporating logic LSI, in particular to a memory incorporating logic LSI provided with a circuit for testing it and a method for testing the same LSI.

Heretofore the test of the memory portion in a memory incorporating logic LSI has been effected, as disclosed in JP-B-57-3107 (corresponding to U.S. Pat. No. 4,074,851), while utilizing scan-in to a flipflop by applying a part of an input pattern to a flipflop provided with scanning function and the rest to an input terminal. In JP-A-61-204744 (corresponding U.S. Pat. No. 4,710,930) by the same inventors, a method, by which the memory portion is provided with scanning function and scan-in and scan-out to and from the memory portion are utilized, has been discussed.

According to all the prior art techniques described above, since the test has been effected by utilizing a scanning function, there has been a problem that dynamic function testing, by which the test is effected with a speed similar to that at the real operation time cannot be affected. As a method to solve this problem, a method is conceivable, by which all of the input and output signal lines of the memory are connected with external terminals (input and output terminal portion). However, by this method another problem is produced that many external terminals are necessary for the LSI.

The object of this invention is to provide a memory incorporating logic LSI and a method for testing the same LSI, with which it is possible to effect a dynamic function test of the memory portion without increasing the number of external terminals of the LSI and further to easily effect the test of the logic circuit portion.

SUMMARY OF THE INVENTION

Firstly a memory incorporating logic LSI that includes an input and output terminal portion, a memory portion, a logic circuit portion, a first signal path, through which a signal is transmitted from the logic circuit portion to the memory portion, and a second signal path, through which the signal is transmitted from the memory portion to the logic circuit portion, comprises an operation mode input circuit portion, which inputs an operation mode signal determining the operational state of the memory incorporating logic LSI through the input and output terminal portion; a memory test input signal path, with which the input and output terminal portion is connected and through which a signal for memory test is inputted and transmitted; a memory test output signal path, which outputs the output signal from the memory portion to the input and output terminal portion; and a signal path switching circuit portion disposed in the course of the first signal path, which transmits the signal from the memory test input signal path by switching off the first signal path from the logic circuit portion on the basis of the operation mode signal.

In a second configuration a memory incorporating logic LSI according to the present invention comprises an operation mode input circuit portion, which inputs an operation mode signal determining the operational state of the memory incorporating logic LSI through the input and output terminal portion, a logic circuit test signal memory circuit portion having an output portion outputting a predetermined logic circuit test pattern inputted from the input and output terminal portion, which inputs a signal outputted from the logic circuit portion to the first signal path and outputs it to the input and output terminal portion, and a signal path switching circuit portion disposed in the course of the second signal path, which transmits the signal from the output portion of the logic circuit test signal memory circuit portion by switching off the second signal path from the memory portion on the basis of the operation mode signal.

In a third configuration a memory incorporating logic LSI according to the present invention comprises a memory test input signal path, with which the input and output terminal portion is connected and through which a signal for memory test is inputted and transmitted, a memory test output signal path, which outputs the output signal from the memory portion to the input and output terminal portion, a logic circuit test signal memory circuit portion having an output portion outputting a predetermined logic circuit test pattern inputted from the input and output terminal portion, which inputs a signal outputted from the logic circuit portion to the first signal path and outputs it to the input and output terminal portion, and signal path switching circuit portions disposed in the course of the first and the second signal paths, which transmits the signal from the memory test input signal path by switching off the first signal path from the logic circuit portion, when the operation mode signal is at the memory test mode, and the signal from the output portion of the logic circuit test signal memory circuit portion by switching off the second signal path from the memory portion, when the operation mode signal is at the logic circuit test mode.

A method for testing a memory incorporating logic LSI according to the present invention is characterized in that an operation mode signal determining the operation mode is inputted to select either one of the memory test and the logic circuit test; the signal path is switched over in the signal path switching circuit portions; a predetermined test signal is inputted from the input and output terminal portion; the result of the test effected by inputting the test signal is observed in the input and output terminal portion; and information obtained by observing the result is compared with predetermined expected information in order to test the memory portion and the logic circuit portion.

Now the operation of the construction described above will be explained.

The signal path switching circuit portion switches the signal path between the first and the second signal paths on the basis of the operation mode signal inputted from the operation mode input circuit portion. When the operation mode signal indicates a memory test, the first signal path is switched from the logic circuit portion to the memory test input signal path connected with the input and output terminal portion. The memory test input signal path inputs an externally produced memory test signal to the memory portion and transmits the result of the test of the memory portion to the input and output terminal portion through the memory test output signal path. When the operation mode signal indicates a logic circuit test, the second signal path is switched from the memory portion to the output portion of the logic signal test signal memory circuit portion. The logic signal test signal memory circuit portion receives a signal outputted from the logic circuit portion stated above to the first signal path and outputs it to the input and output terminal portion. It outputs also a predetermined logic circuit test pattern, inputted from the input and output terminal portion, from the output portion to the logic circuit portion stated above through the second signal path.

DETAILED DESCRIPTION OF THE PRESENT INVENTION

Hereinbelow an embodiment of this invention will be explained, referring to FIGS. 1 to 6.

Figure 1:
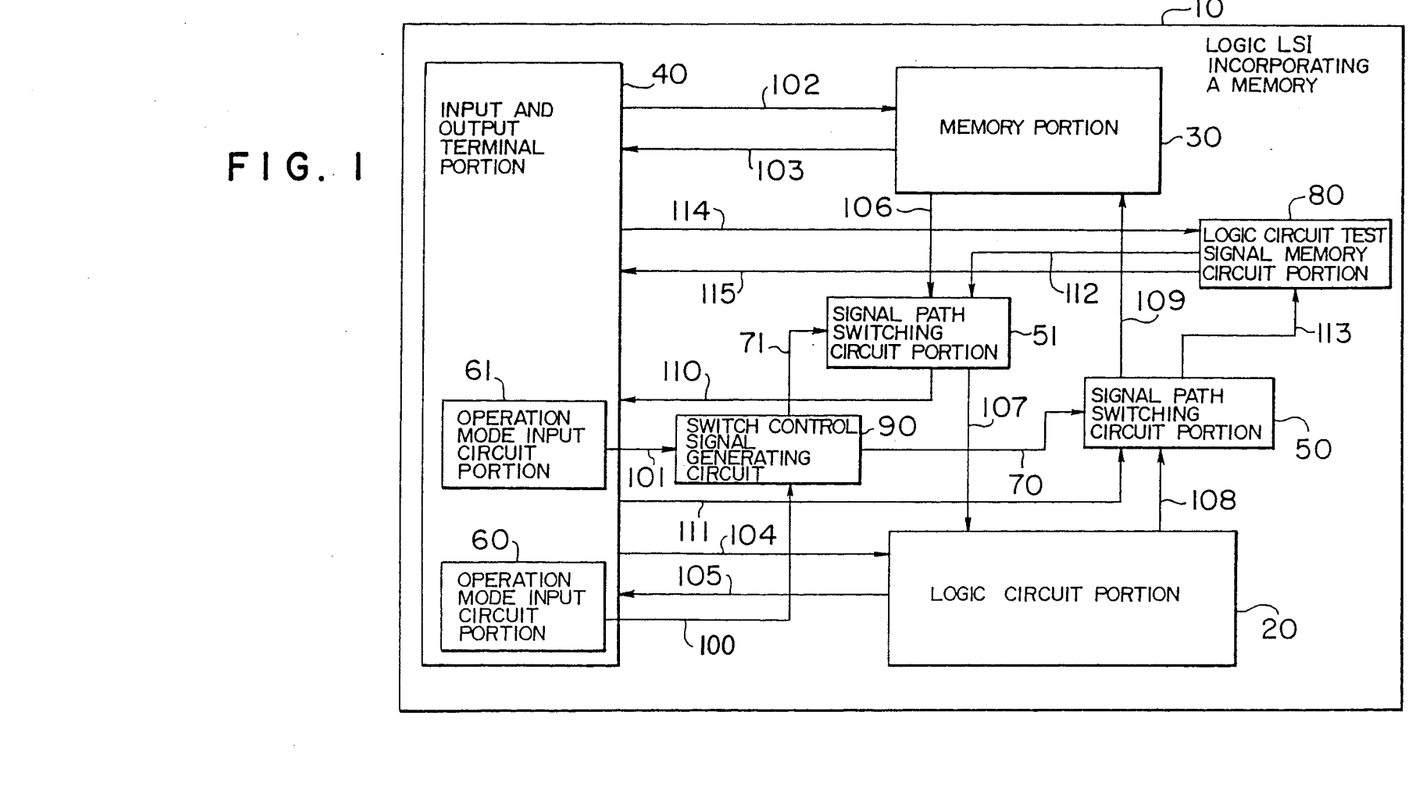
FIG. 1 is a circuit diagram showing the circuit construction of a memory incorporating logic LSI, which is an embodiment of the present invention.
Figure 2A:
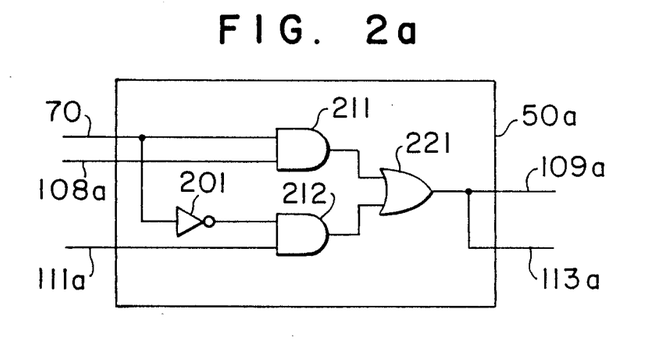
FIGS. 2a and 2b show two different circuit constructions of a signal path switching circuit portion.
Figure 2B:
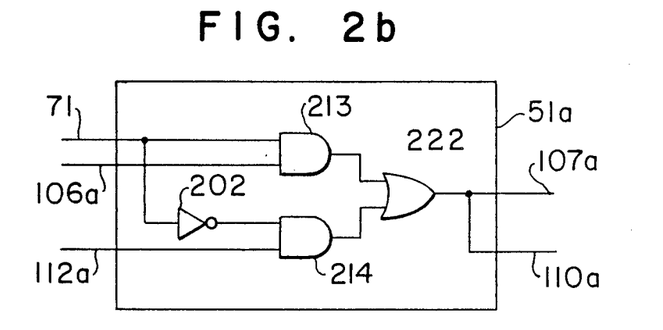

FIG. 1 is a block diagram illustrating a circuit construction of a memory incorporating logic LSI 10 according to the present invention. The memory incorporating LSI 10 includes a logic circuit portion 20 consisting of combined logic elements determining an output signal according to predetermined logic, responding to an input signal, and memory logic elements determining the output signals, based on the input signals and the internal state, and an input and output terminal portion 40, which transmits and receives input and output signals from and to the exterior of the LOGIC LSI 10. There are disposed switching circuit portions (signal path switching circuit portions) 50 and 51 for switching over groups of signal lines. Signal path switching circuit portion 50 operates between a group of signal lines (first signal path) 108, 109 transmitting the signal from the logic circuit portion 20 to the memory portion 30 and signal path switching circuit portion 51 operates between a group of signal lines (second signal path) 106, 107 transmitting the signal from the memory portion 30 to the logic circuit portion 20, respectively. FIGS. 2a and 2b show two different examples of the circuit construction of the switching circuit within the switching circuit portions 50 and 51.

Figure 3:
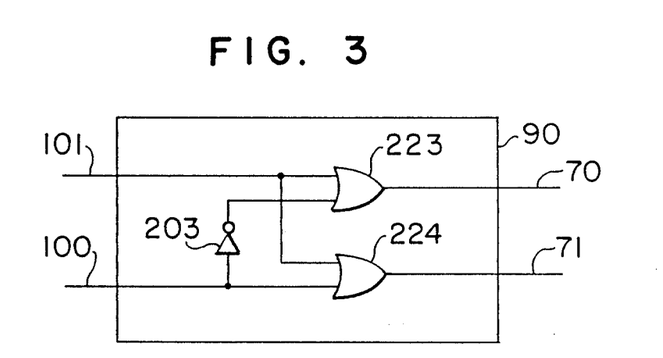
FIG. 3 shows a circuit construction of a switch control signal generating circuit.

In the switching circuit 50a indicated in FIG. 2a, in the case where the value of a switch control signal line 70 has a logic value '0', since the output of an AND gate 211 has a logic value '0', the value in a signal line 111a within a group of signal lines (memory test input signal path) 111 appears at the output of an OR gate 221, which value is supplied to signal lines 109a, 113a within groups of signal lines 109, 113. The operation of the switching circuit 51a indicated in FIG. 2b is identical to that described above. Switch control signal lines 70 and 71 are fed by a switch control signal generating circuit 90. FIG. 3 shows an example of the circuit construction of the switch control signal generating circuit 90.

In the switch control signal generating circuit 90 indicated in FIG. 3, when the value in a signal line 101 is '1', both the values in switch control signal lines 70 and 71 are '1', and when the value in the signal line 101 is '0' both of the values in switch control signal lines are '0'. In the case where the value in a signal line 100 is '0', the value in switch control signal lines 70 and 71 are '1' and '0' respectively, and in the case where the value in the signal lines 100 is '1' the value in the switch control signal lines 70 and 71 are '0' and '1', respectively. The signal lines 100 and 101 are fed with signals by a switch control terminal and a mode control terminal within operation mode input circuit portions 60 and 61. Consequently it is possible to set directly the values in the switch control signal lines 70 and 71 with inputs from the exterior using the switch control signal generating circuit 90. In addition, the memory incorporating logic LSI 10 includes a testing flipflop portion (logic circuit test signal memory circuit portion) 80.

Now a method for testing the memory incorporating logic LSI 10 according to the present invention indicated in FIG. 1 will be explained. At first a method for testing the memory portion 30 and then a method for testing the logic circuit portion 20 will be explained.

Figure 5:
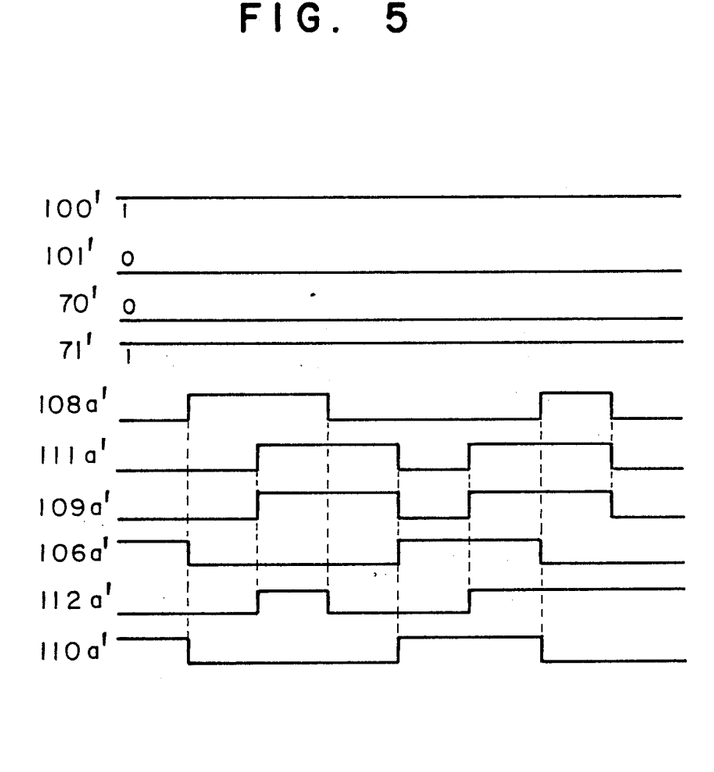
FIG. 5 is a timing chart of signals at the test of the memory portion.

The test of the memory portion 30 of the memory incorporating logic LSI 10 is effected as follows. To the test of the memory portion 30, '0' is applied to the mode control terminal in the operation mode input circuit portion 61 and '1' is applied to the switch control terminal in the operation mode input circuit portion 60 continuously. In this way, since the values in the switch control signal lines 70 and 71 are '0' and '1', respectively, values in the group of signal lines 111 are supplied to the group of signal lines 109 in the switching circuit portion 50 and values in the group of signal lines 106 are supplied to the group of signal lines 110 in the switching circuit portion 51. FIG. 5 shows a timing chart indicating transmission of the signals at the test of the memory portion 30. That is, at the test of the memory portion 30, the logic value 111a' in the signal line 111a within the group of signal lines 111 inputted from the input and output terminal portion 40 appears as the logic value 109a' in the signal line 109a within the group of input signal lines 109 as it is, and the logic value 106a' in the signal line 106a within the group of output signal lines 106 from the memory portion 30 appears as the logic value 110a' in the signal line 110a within the group of signal lines 110 outputted to the input and output terminal portion 40 as it is. It is thus indicated that logic values 108a', 112a' in the signal lines 108a, 112a within the groups of signal lines 108, 112 have no influence. Consequently the test of the memory portion 30 is effected by applying an input pattern to the input terminal in the input and output terminal portion 40 connected with the groups of signal lines 102, 111 and comparing an output pattern observed at the output terminal in the input and output terminal portion 40 connected with the groups of signal lines 103, 110 with an expected pattern. In this way, according to this embodiment, since at the test of the memory portion 30 all the input and output signals to and from the memory portion 30 can be controlled and observed from the exterior, an effect is obtained that the memory portion 30 can be tested with a working speed identical to that at the real operation.

Figure 6:
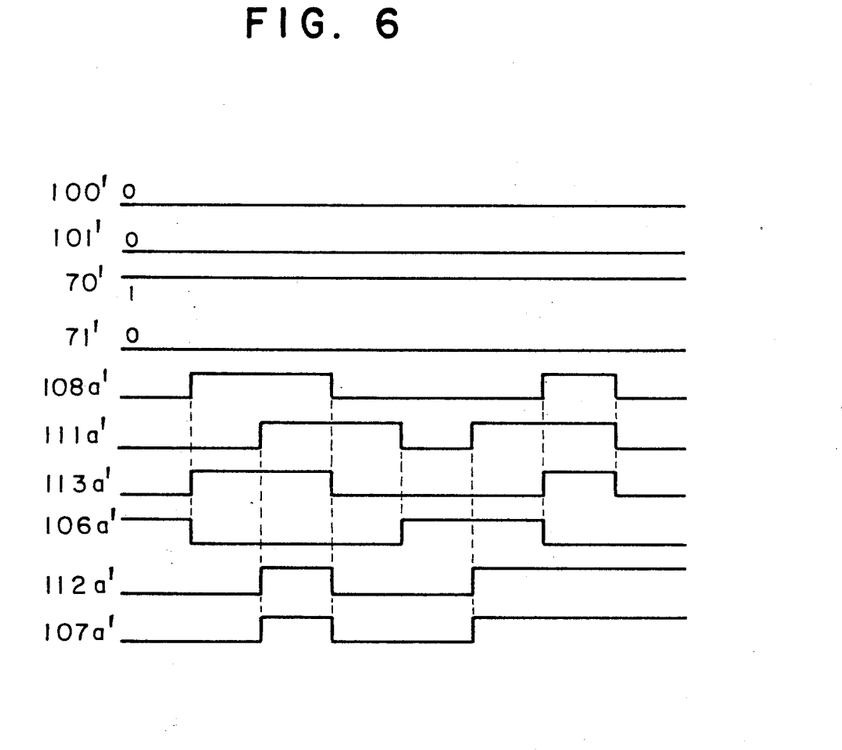
FIG. 6 is a timing chart of signals at the test of the logic circuit portion.

Next the test of the logic circuit portion 20 of the memory incorporating logic LSI 10 is effected as follows. At the test of the logic circuit portion 20 '0' is applied to the mode control terminal in the operation mode input circuit portion 61 and '0' is applied to the switch control terminal in the operation mode input circuit portion 60 continuously. In this way, since the values in the switch control signal lines 70 and 71 are '1' and '0', respectively, values in the group of signal lines 108 are supplied to the group of signal lines 113 in the switching circuit portions 50 and values in the group of signal lines 112 are supplied to the group of signal lines 107 in the switching circuit portion 51. FIG. 6 shows a timing chart indicating transmission of the signals at the test of the logic circuit portion 20. That is, at the test of the logic circuit portion 20, the logic value 112a' in the signal line 112a within the group of signal lines 112 coming from the testing flipflop portion 80 appears as the logic value 107a' in the signal line 107a within the group of input signal lines 107 as it is, and the logic value 108a' in the signal line 108a within the group of output signal lines 108 from the logic circuit portion 20 appears as the logic value 113a' in the signal line 113a within the group of signal lines 113 to the testing flip-flop portion 80 as it is. It is thus indicated that logic values 106a', 111a' in the signal lines 106a, 111a within the groups of signal lines 106, 111 have no influence. Consequently the test of the logic circuit portion 20 is effected by applying a pattern of the input pattern to the input, terminal in the input and output terminal portion 40 connected with the group of signal lines 104, at the same time setting the remaining part of the input pattern to the flipflop having a scanning function within the testing flipflop portion 80 by means of a scan-in 114 and comparing the output pattern observed at the output terminal in the input and output terminal portion 40 connected with the group of signal lines 105 and the pattern scanned-out 115 from the flipflop having a scanning function within the testing flipflop portion 80 with an expected pattern. In this way, according to this embodiment, since at the test of the logic circuit portion 20 it is not necessary at all to take the state of the memory portion 30 into account, an effect is obtained that a test pattern for the logic circuit portion 20 can be easily formed.

FIGS. 4a to 4d show four examples of the circuit construction, in the case where an external terminal used for the test of the memory portion 30 is used in common as an external terminal used for the usual operation.

Figure 4A:
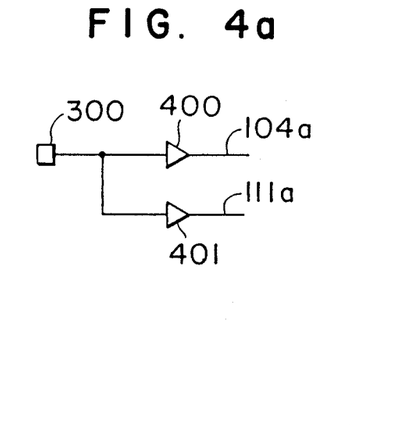
FIGS. 4a to 4d show four different circuit constructions of the signal path switching circuit portion, which is used in common as an external terminal.

FIG. 4a shows the circuit construction in the case where the input terminal used for the usual operation is used in common as the input terminal for the test of the memory portion. In this case, at the usual operation and at the test of the logic circuit portion 20 the signal is sent to the signal line 104a supplying the input signal from the external terminal 300 to the logic circuit portion 20 through an input buffer gate 400. On the contrary, at the test of the memory portion 30, the signal is sent to the signal line 111a supplying the memory portion testing input signal through another input buffer gate 401.

Figure 4B:
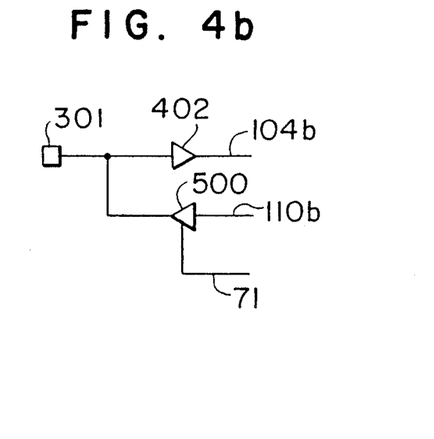

FIG. 4b shows the circuit construction in the case where the input terminal used for the usual operation is used in common as the output terminal for the test of the memory portion. In this case, at the usual operation and at the test of the logic circuit portion 20 the value in the switch control signal line 71 giving the control signal of the output buffer gate 500 is '0'. Consequently the output of the output buffer gate 500 is in the high impedance state and a signal is sent to the input signal line 104b from the external terminal 301 to the logic circuit portion 20 through an input buffer gate 402. Therefore, at the test of the memory portion 30, since the value in the switch control signal line 71 is turned to '1', a signal is sent from the memory testing output signal line 110b to the external terminal 301 through the output buffer gate 500.

Figure 4C:
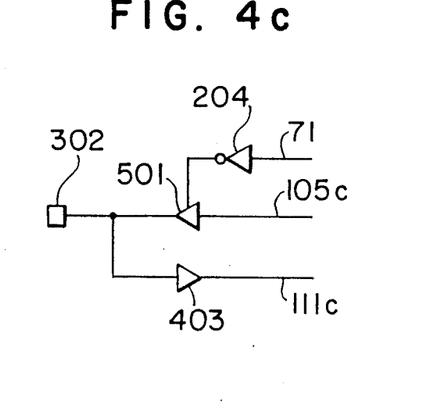

FIG. 4c shows the circuit construction in the case where the output terminal used for the usual operation is used in common as the input terminal for the test of the memory portion. In this case, at the usual operation and at the test of the logic circuit portion 20, since the value in the switch control signal line 71 is '0' and therefore the output value of a NOT gate 204 is '1', a signal is sent from the output signal line 105c of the logic circuit portion 20 to the external terminal 302 through a buffer gate 501. On the contrary, at the test of the memory portion 30, since the value in the switch control signal line 71 is '1', the output value of the NOT gate 204 is '0'. Consequently the output of the output buffer gate 501 is in the high impedance state and a signal is sent from the external terminal 302 to the memory portion testing input signal line 111c through an input buffer gate 403.

Figure 4D:
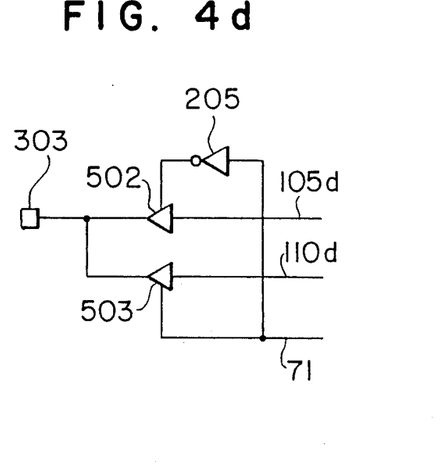

FIG. 4d shows the circuit construction in the case where the output terminal used for the usual operation is used in common as the output terminal for the test of the memory portion. In this case, at the usual operation and at the test of the logic circuit portion 20 the value in the switch control signal line 71 is '0' and it is '1' at the test of the memory portion 30. Consequently, at the usual operation and at the test of the logic circuit portion 20, since the output value of the output buffer gate 503 is in the high impedance state, the signal is sent from the output signal line 105d of the logic circuit portion 20 to the external terminal 303 through the output buffer gate 502. On the contrary, at the test of the memory portion 30, since the output value of the output buffer gate 502 is in the impedance state, the signal is sent from the output line 110d for the test of the memory portion to the external terminal 303 through the output buffer gate 503.

According to the embodiments of this invention indicated in FIGS. 4a to 4d an effect can be obtained that the increase in the number of external terminals is small, because the external terminals used for the test of the memory portion is used in common as those used for the usual operation.

According to this invention, in a memory incorporating logic LSI, by disposing signal path switching circuit portions in the course of signal paths between the memory portion and the logic circuit portion, since at the test of the memory portion it is possible to switch-on the signal paths effecting the test signal input to the memory portion and the observation of the output signal from the memory portion at the input and output terminal portion, the dynamic function test of the memory portion is possible owing to the signal path switching circuit portion. Further, since at the test of the logic circuit portion it is possible to switch over the signal path from the output signal path from the memory portion to the signal path from the logic circuit test signal memory circuit portion so as to input the signal in the logic circuit portion, an excellent effect can be obtained in that it is possible to effect the test of the logic circuit portion, independently of the state of the memory portion, and thus formation of the test pattern is made easier.

We claim:

1. A memory incorporating logic LSI comprising:
   an input and output terminal portion, which is capable of interfacing to an exterior of the LSI and which receives input and transmits output signals;

a memory portion, to and from which information is written and read out from the LSI, respectively, through said input and output terminal portion;

a logic circuit portion, which determines an output signal according to a predetermined logic, responding to an input signal;

a first signal path, through which a first signal is transmitted from said logic circuit portion to said memory portion;

a second signal path, through which a second signal is transmitted from said memory portion to said logic circuit portion;

operation mode input circuit portions, which input a plurality of operation mode signals, that determine the operational state of said memory incorporating logic LSI, via said input and output terminal portion;

a memory test input signal path, connected to said input and output terminal portion and through which an input signal for memory test, which is inputted from said input and output terminal portion, is transmitted to said memory portion;

a memory test output signal path, through which an output signal for memory test which is an output of said memory portion, is transmitted to said input and output terminal portion; and a signal path switching circuit portion disposed in said first signal path, which transmits said input signal for memory test from said memory test input signal path to said memory portion by switching off said first signal path from said logic circuit portion to said memory portion on the basis of said operation mode signals.

2. A memory incorporating logic LSI according to claim 1, wherein an input terminal, which applies a test signal from the exterior to said memory test input signal path, is also used as an input terminal, through which a signal is inputted from the exterior to said logic circuit portion, during regular operation.

3. A memory incorporating logic LSI according to claim 1, wherein an output terminal, which outputs a signal from said memory test input signal path to the exterior, is also used as an input terminal through which a signal is inputted from the exterior to said logic circuit portion, during regular operation.

4. A memory incorporating logic LSI according to claim 1, wherein an input terminal, which applies a test signal from the exterior to said memory test input signal path, is also used as an output terminal through which a signal is outputted from said logic circuit portion to the exterior, during regular operation.

5. A memory incorporating logic LSI according to claim 1, wherein an output terminal, which outputs a signal from said memory test input signal path to the exterior, is also used as an output terminal through which a signal is outputted from said logic circuit portion to the exterior, during regular operation.

6. A memory incorporating logic LSI comprising:

an input and output terminal portion, which is capable of interfacing to an exterior of the LSI and which receives input and transmits output signals;

a memory portion to and from which information is written to and read out from the LSI, respectively, through said input and output terminal portion;

a logic circuit portion, which determines an output signal according to a predetermined logic, responding to an input signal;

a first signal path, through which a first signal is transmitted from said logic circuit portion to said memory portion;

a second signal path, through which a second signal is transmitted from said memory portion to said logic circuit portion;

operation mode input circuit portions, which input a plurality of operation mode signals that determine the operational state of said memory incorporating logic LSI, via said input and output terminal portion;

a logic circuit test signal memory circuit portion having a first output portion outputting a predetermined logic circuit test pattern received from said input and output terminal portion, which also receives as an input a signal transmitted from said logic circuit portion along said first signal path and outputs the signal received from said first signal path to said input and output terminal portion; and a signal path switching circuit portion disposed in said second signal path, which transmits a signal from said output portion of said logic circuit test signal memory circuit portion to said logic circuit portion and which switches off said second signal path from said memory portion to said logic circuit portion on the basis of said operation mode signals.

7. A memory incorporating logic LSI comprising:

an input and output terminal portion, which is capable of interfacing to an exterior of the LSI and which receives input and transmits output signals;

a memory portion, to and from which information is written to and read from the LSI, respectively, through said input and output terminal portion;

a logic circuit portion, which determines an output signal according to a predetermined logic, responding to an input signal;

a first signal path, through which a first signal is transmitted from said logic circuit portion to said memory portion;

a second signal path, through which a second signal is transmitted from said memory portion to said logic circuit portion;

operation mode input circuit portions, which input a plurality of operation mode signals determining the operational state of said memory incorporating logic LSI through said input and output terminal portion;

a memory test input signal path, connected to said input and output terminal portion and through which an input signal for memory test, which is inputted from said input and output terminal portion, is transmitted to said memory portion;

a memory test output signal path, through which an output signal for memory test, which is an output of said memory portion, is transmitted to said input and output terminal portion;

a logic circuit test signal memory circuit portion having an output portion outputting a predetermined logic circuit test pattern inputted from said input and output terminal portion, wherein said logic circuit test signal memory circuit portion inputs a signal, which is outputted from said logic circuit portion, onto said first signal path and outputted from said logic circuit portion onto said first signal path and outputs it to said input and output terminal portion; and signal path switching circuit portions disposed in said first and said second signal paths, respectively, which transmits a signal from said memory test input signal path to said memory portion and switches off said first signal path from said logic circuit portion to said memory portion, when said operation mode signals designate a memory test mode, and also transmits a signal from said output portion of said logic circuit test signal memory circuit portion to said logic circuit portion and switches off said second signal path from said memory portion to said logic circuit portion, when said operation mode signals designate a logic circuit test mode.

8. A memory incorporating logic LSI according to claim 7, wherein an input terminal, which applies a test signal from the exterior to said memory test input signal path, is also used as an input terminal through which a signal is inputted from the exterior to said logic circuit portion, during a regular operation.

9. A memory incorporating logic LSI according to claim 7, wherein an output terminal, which outputs a signal from said memory test input signal path to the exterior, is also used as an input terminal through which a signal is inputted from the exterior to said logic portion, during a regular operation.

10. A memory incorporating logic LSI according to claim 7, wherein an input terminal, which applies a test signal from the exterior to said memory test input signal path, is also used as an output terminal, through which a signal is outputted from said logic circuit portion to the exterior, during a regular operation.

11. A memory incorporating logic LSI according to claim 7, wherein an output terminal, which outputs a signal from said memory test input signal path to the exterior, is also used as an output terminal, through which a signal is outputted from said logic circuit portion to the exterior, during a regular operation.

12. A method for testing a memory incorporating logic LSI including an input and output terminal portion, which receives and transmits input and output signals from and to the exterior; a memory portion, to and from which information is written to and read out from the exterior, respectively, through said input and output terminal portion; a logic circuit portion, which determines an output signal according to a predetermined logic, responding to a input signal; a first signal path, through which a signal is transmitted from said logic circuit portion to said memory portion; a second signal path, through which a signal is transmitted from said memory portion to said logic circuit portion; operation mode input circuit portions, which input a plurality of operation mode signals determining the operational state of said memory incorporating logic LSI through said input and output terminal portion; a memory test input signal path, connected to said input and output terminal portion and through which an input signal for memory test, which is inputted from said input and output terminal portion, is transmitted to said memory portion; a memory test output signal path, through which an output signal for memory test, which is outputted from said memory portion, is transmitted to said input and output terminal portion; a logic circuit test signal memory circuit portion having an output portion outputting a predetermined logic circuit test pattern inputted from said input and output terminal portion, wherein said logic circuit test signal memory circuit portion inputs a signal which is outputted from said logic circuit portion onto said first signal path and outputs it to said input and output terminal portion; and signal path switching circuit portions disposed in said first and said second signal path, respectively, which transmits a signal from said memory test input signal path to said memory portion and switches off said first signal path from said logic circuit portion to said memory portion, when said operation mode signals designate a memory test mode, and also transmits a signal from said output portion of said logic circuit test signal memory circuit portion to said logic circuit portion and switches off said second signal path from said memory portion to said logic circuit portion, when said operation mode signals designate a logic circuit test mode, in order to test said memory portion and said logic circuit portion, said method comprising the steps of:

inputting said operation mode signals to determine an operation mode of said memory incorporating logic LSI so as to select one of the memory test and the logic circuit test modes;

switching over the signal path in said signal path switching circuit portions;

inputting a predetermined test signal from said input and output terminal portion;

observing the result of the test effected by inputting said test signal in said input and output terminal portion; and comparing information obtained by observing said result with predetermined expected information.

* * * * *